(12) United States Patent
Liao (10) Patent No.: US 10,636,937 B2
(45) Date of Patent: Apr. 28, 2020

(54) METHOD FOR MANUFACTURING LIGHT-EMITTING MODULE

(71) Applicant: ASTI GLOBAL INC., TAIWAN, Changhua County (TW)

(72) Inventor: Chien-Shou Liao, New Taipei (TW)

(73) Assignee: ASTI GLOBAL INC., Changhua County (TW)

( * ) Notice: Subject to any disclaimer, the term of this patent is extended or adjusted under 35 U.S.C. 154(b) by 24 days.

(21) Appl. No.: 16/121,933

(22) Filed: Sep. 5, 2018

(65) Prior Publication Data

US 2019/0097081 A1 Mar. 28, 2019

(30) Foreign Application Priority Data

Sep. 22, 2017 (TW) .............................. 106132583 A (51) Int. Cl.
| | |
|---|---|
| *H01L 33/00* | (2010.01) |
| *H01L 33/52* | (2010.01) |
| *H01L 25/075* | (2006.01) |
| *H01L 33/62* | (2010.01) |

(52) U.S. Cl.
CPC ...... *H01L 33/0095* (2013.01); *H01L 25/0753* (2013.01); *H01L 33/52* (2013.01); *H01L 33/62* (2013.01); *H01L 2933/005* (2013.01); *H01L 2933/0033* (2013.01); *H01L 2933/0066* (2013.01)

(58) Field of Classification Search
None
See application file for complete search history.

(56) References Cited

U.S. PATENT DOCUMENTS

| | | | |
|---|---|---|---|
| 8,896,010 B2 * | 11/2014 | Tischler | H01L 24/96 257/98 |
| 10,181,546 B2 * | 1/2019 | Zou | H01L 21/68 |
| 2011/0151602 A1 * | 6/2011 | Speier | H01L 33/0079 438/26 |
| 2017/0352778 A1 * | 12/2017 | Chien | H01L 33/0079 |

* cited by examiner

*Primary Examiner* — Bradley Smith
(74) *Attorney, Agent, or Firm* — Li & Cai Intellectual Property (USA) Office (57) ABSTRACT

A method for manufacturing a light-emitting module includes: firstly, attaching a semiconductor structure on a first supporting substrate, the semiconductor structure including a bottom layer and a plurality of light-emitting chips disposed on the bottom layer; next, separating the bottom layer from the semiconductor structure, the light-emitting chips being borne on the first supporting substrate; then, attaching the first supporting substrate with the light-emitting chips on a second supporting substrate; subsequently, separating the first supporting substrate from each light-emitting chip, each light-emitting chip having at least two lands exposed to exterior; next, separating each light-emitting chip from the second supporting substrate; and then disposing each light-emitting chip on a circuit board. Therefore, the light-emitting module is finished by the above-mentioned steps.

10 Claims, 8 Drawing Sheets

METHOD FOR MANUFACTURING LIGHT-EMITTING MODULE

CROSS-REFERENCE TO RELATED PATENT APPLICATION

This application claims the benefit of priority to Taiwan Patent Application No. 106132583 filed on Sep. 22, 2017. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a manufacturing method, and more particularly to a method for manufacturing a light-emitting module.

BACKGROUND OF THE DISCLOSURE

Light-emitting diode (LED) is widely applied for its good light quality and high luminous efficiency. Generally, conventional full-color LED display devices includes red, green, and blue LED chips cooperated together to widen color gamut and enhance the color rendering. The red, green, and blue LED chips can respectively emit red, green, and blue colored lights. Therefore, the full-color LED display devices can produce a full-color light by directly emitting the single red, green, or blue colored lights or superposing at least two of the red, green, blue colored lights to display the colored information.

SUMMARY OF THE DISCLOSURE

The present disclosure provides a method for manufacturing a light-emitting module according to conventional technical inadequacies.

In one aspect, the present disclosure provides a method for manufacturing a light-emitting module including steps of disposing a semiconductor structure on a first adhesive layer of a first supporting substrate; wherein the semiconductor structure includes a bottom layer and a plurality of light-emitting chips separately disposed on the bottom layer, and the light-emitting chips are attached on the first adhesive layer; irradiating a contact surface between each the light-emitting chip and the bottom layer by a first light source; separating the bottom layer form the semiconductor structure by a radiation of the first light source; wherein the light-emitting chips are borne on the first supporting substrate and a back of each the light-emitting chip is exposed out of the first adhesive layer; disposing the first supporting substrate with the light-emitting chips on a second adhesive layer of a second supporting substrate; wherein the light-emitting chips are attached on the second adhesive layer and the back of each the light-emitting chips is covered by the second adhesive layer; irradiating a contact surface between each the light-emitting chip and the first adhesive layer by a second light source; separating the first supporting substrate from each the light-emitting chip by a radiation of the second light source; wherein at least two lands of each the light-emitting chip are exposed out of the first adhesive layer; irradiating a contact surface between each the light-emitting chip and the second adhesive layer by a third light source; separating each the light-emitting chip from the second supporting substrate by a radiation of the third light source; disposing each the light-emitting chip on a circuit board; wherein the at least two lands of each light-emitting chip are respectively electrically connected to the circuit board through two solder balls; and irradiating the solder balls by a fourth light source to connect the at least two lands of each the light-emitting chip with the corresponding two solder balls.

In one aspect, the present disclosure provides another method for manufacturing a light-emitting module including steps of disposing a semiconductor structure on a first adhesive layer of a first supporting substrate; wherein the semiconductor structure includes a bottom layer and a plurality of light-emitting chips separately disposed on the bottom layer, and the light-emitting chips are attached on the first adhesive layer; separating the bottom layer form the semiconductor structure by a radiation of a first light source; wherein the light-emitting chips are borne on the first supporting substrate and a back of each the light-emitting chip is exposed out of the first adhesive layer; disposing the first supporting substrate with the light-emitting chips on a second adhesive layer of a second supporting substrate; wherein the light-emitting chips are attached on the second adhesive layer and the back of each the light-emitting chips is covered by the second adhesive layer; separating the first supporting substrate from each the light-emitting chip by a radiation of a second light source; wherein at least two lands of each the light-emitting chip are exposed out of the first adhesive layer; separating each the light-emitting chip from the second supporting substrate by a radiation of a third light source; disposing each the light-emitting chip on a circuit board; wherein the at least two lands of each light-emitting chip are electrically connected to the circuit board through two solder balls; and connecting the at least two lands of each the light-emitting chip with the corresponding two solder balls by a radiation of a fourth light source.

In one aspect, the present disclosure provides the other method for manufacturing a light-emitting module including steps of attaching a semiconductor structure on a first supporting substrate; wherein the semiconductor structure includes a bottom layer and a plurality of light-emitting chips disposed on the bottom layer; separating the bottom layer form the semiconductor structure; wherein the light-emitting chips are borne on the first supporting substrate; attaching the first supporting substrate with the light-emitting chips on a second supporting substrate; separating the first supporting substrate from each the light-emitting chip; wherein at least two lands of each the light-emitting chip are exposed to exterior; and electrically connecting the light-emitting chips to a circuit board; wherein the step of electrically connecting the light-emitting chips to the circuit board further includes a step (A) or a step (B); wherein the step (A) includes separating the light-emitting chips from the second supporting substrate and then disposing the light-emitting chips on the circuit board; wherein the step (B) includes disposing the light-emitting chips on the circuit board and then separating the light-emitting chips from the second supporting substrate.

Therefore, the present disclosure provides a method for manufacturing a light-emitting module using the technical features of "disposing or attaching the semiconductor structure on the first supporting substrate", "removing the bottom layer from the semiconductor structure", "disposing the first supporting substrate with the light-emitting chips on the second supporting substrate", "separating the first supporting substrate from the light-emitting chips", and "electrically connecting the light-emitting chips and the circuit board" to complete the preparation of the light-emitting module.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 10, a first embodiment of the present disclosure provides a method for manufacturing a light-emitting module which can be conducted by steps as follow.

Figure 1:
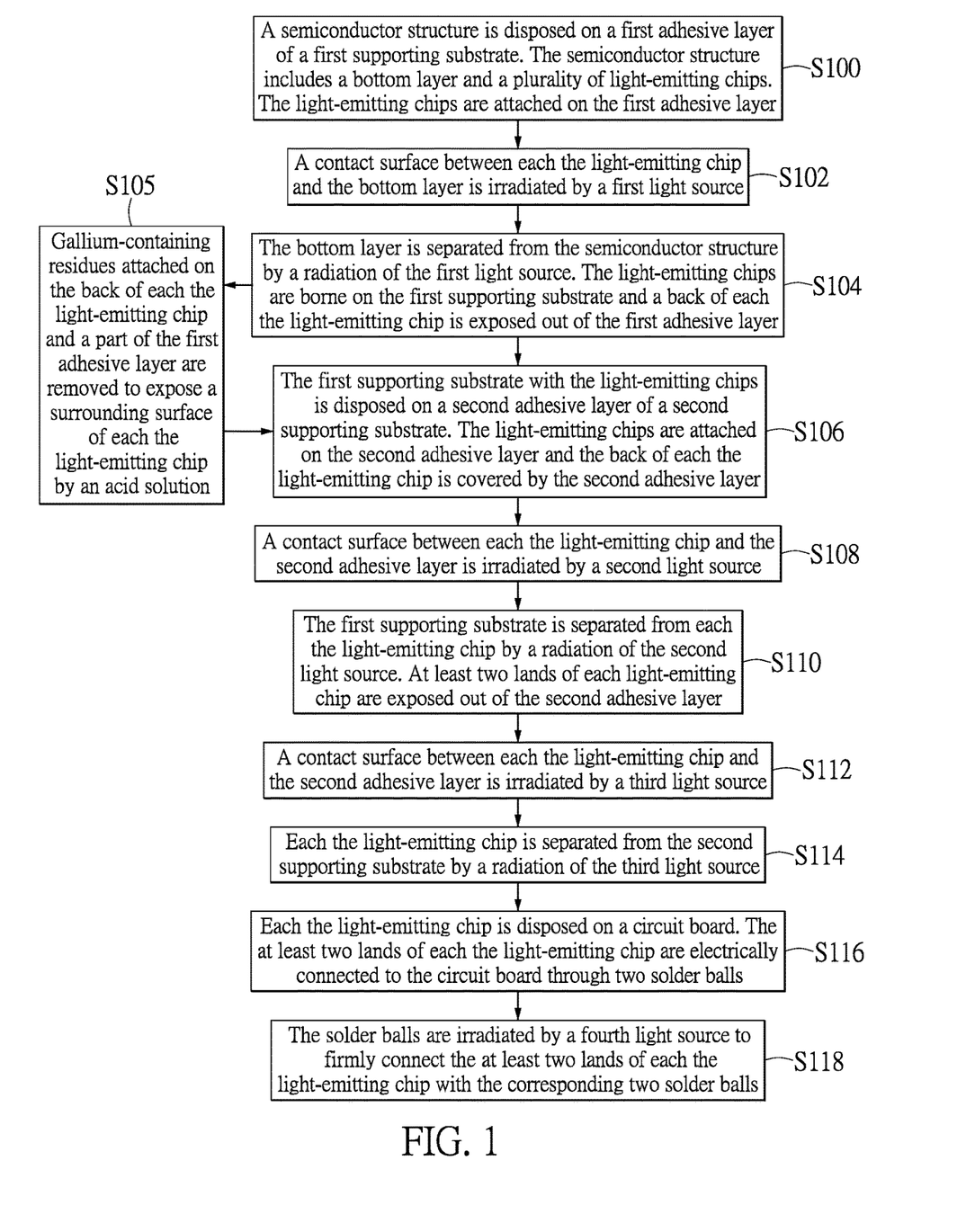
FIG. 1 is a flowchart of a method for manufacturing a light-emitting module according to a first embodiment of the present disclosure.
Figure 2:
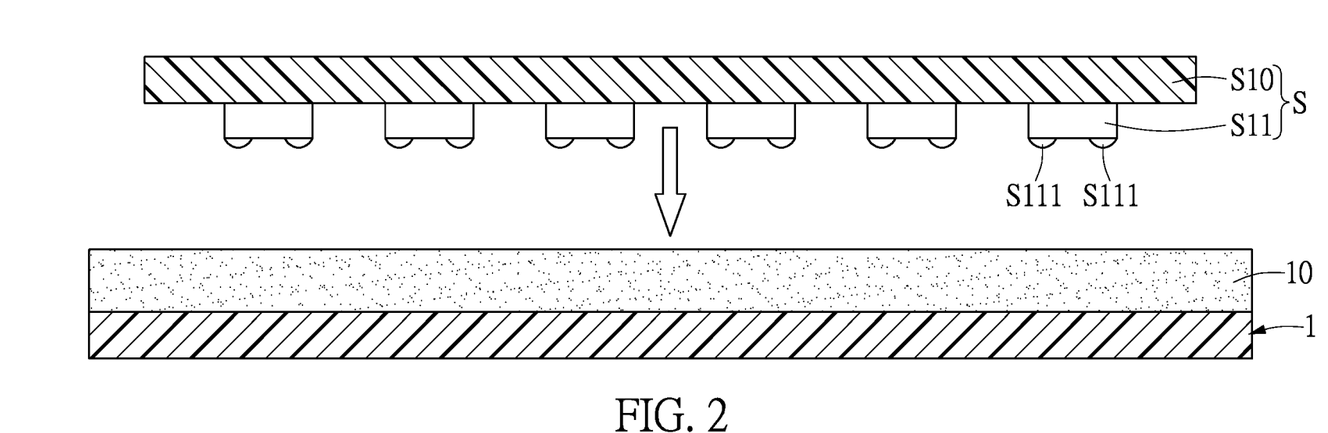
FIG. 2 is a side view before disposing a semiconductor structure on a first adhesive layer of a first supporting substrate according to the first embodiment of the present disclosure.
Figure 3:
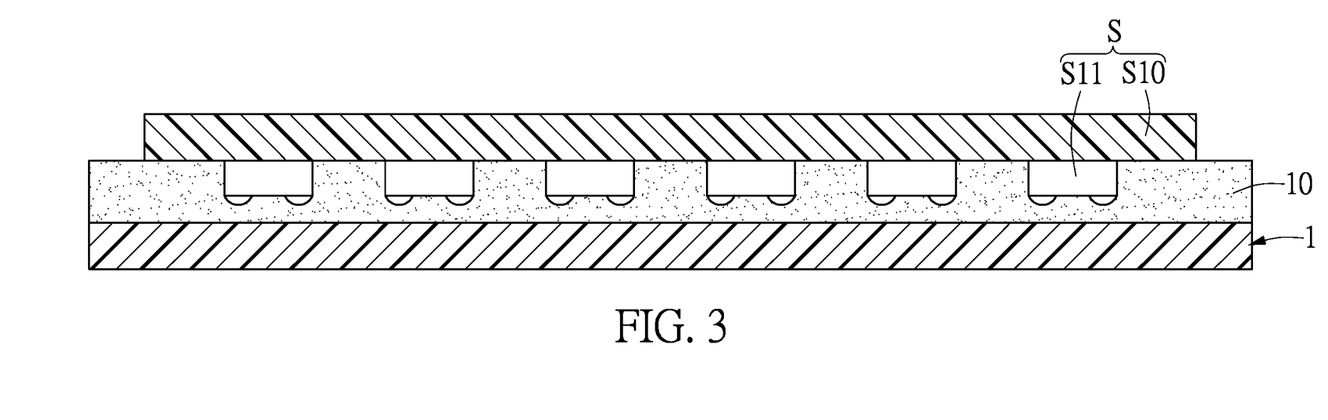
FIG. 3 is a side view of step S100 in the method for manufacturing the light-emitting module according to the first embodiment of the present disclosure.

At first, referring to FIG. 1 to FIG. 3, a semiconductor structure S is disposed on a first adhesive layer 10 of a first supporting substrate 1. The semiconductor structure S includes a bottom layer S10 and a plurality of light-emitting chips S11 separately disposed on the bottom layer S10 (step S100). That is, after disposing the semiconductor structure S on the first adhesive layer 10 of the first supporting substrate 1, the light-emitting chips S11 will embed in the first adhesive layer 10. For example, the bottom layer S10 can be a sapphire bottom layer, a silicon bottom layer, or bottom layers made of other material; while, the light-emitting chips S11 can be gallium nitride (GaN) LED chips or other types of semiconductor LED chips, but is not limited thereto.

Figure 4:
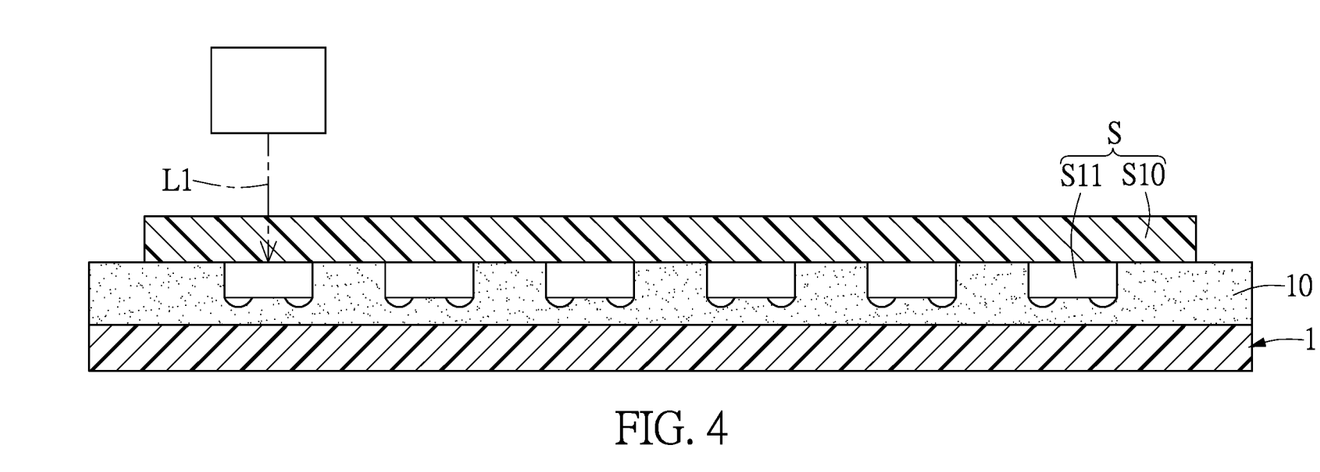
FIG. 4 is a side view of step S102 in the method for manufacturing the light-emitting module according to the first embodiment of the present disclosure.

Referring to FIG. 1 and FIG. 4, a contact surface between each the light-emitting chip S11 and the bottom layer S10 is irradiated by a first light source L1 (step S102). For example, the first light source L1 can sequentially irradiate every contact surface between each the light-emitting chips S11 and the bottom layer S10; or, the first light source L1 can also simultaneously irradiate multiple contact surfaces between each the light-emitting chips S11 and the bottom layer S10 in a larger radiation area, but is not limited thereto.

Figure 5:
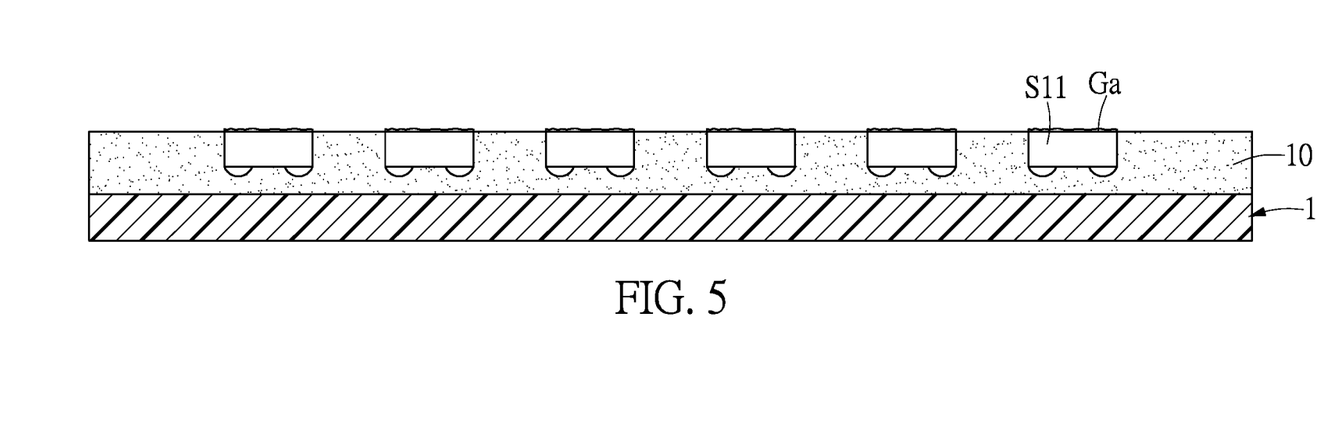
FIG. 5 is a side view of step S104 in the method for manufacturing the light-emitting module according to the first embodiment of the present disclosure.

Then, referring to FIG. 1, FIG. 4, and FIG. 5, the bottom layer S10 is separated from the semiconductor structure S by a radiation of the first light source L1. The light-emitting chips S11 are borne on the first supporting substrate 1 and a back of each the light-emitting chip S11 is exposed out of the first adhesive layer 10 (step S104). Further, referring to FIG. 4, the first light source L1 passes through the bottom layer S10 and projects on the contact surface between each the light-emitting chip S11 and the bottom layer S10 to separate each the light-emitting chip S11 from the bottom layer S10. That is, the adherence between the light-emitting chips S11 and the bottom layer S10 can be weakened by the radiation of the first light source L1 onto the bottom layer S10 for ease of separating the bottom layer S10 from the light-emitting chips S11.

Figure 6:
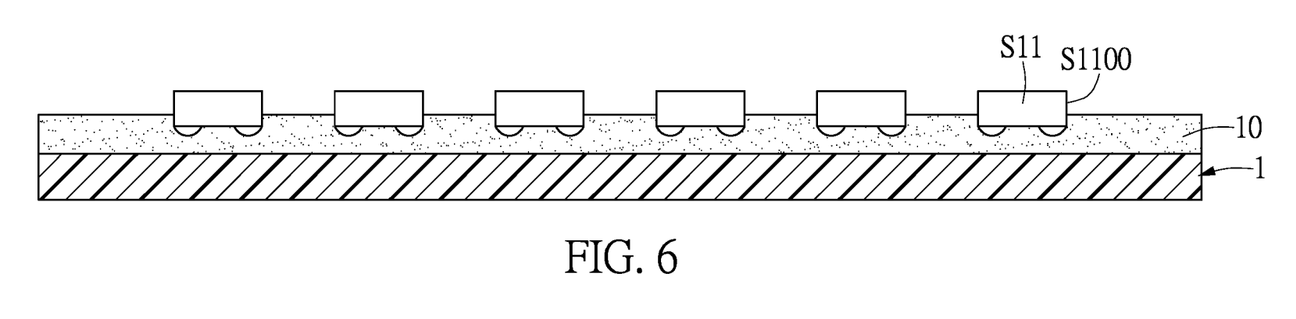
FIG. 6 is a side view of step S105 in the method for manufacturing the light-emitting module according to the first embodiment of the present disclosure.

Referring to FIG. 1, FIG. 5, and FIG. 6, it should be noted that the gallium-containing residues attached on the back of each the light-emitting chip S11 and a part of the first adhesive layer 10 are removed to expose a surrounding surface S1100 of each the light-emitting chip S11 by an acid solution (step S105) after the step S104 of separating the bottom layer S10 from the semiconductor structure S. For example, the acid solution can be hydrochloric acid (HCl), sulfuric acid ($H_2SO_4$), nitric acid ($HNO_3$), or acetic acid ($CH_3COOH$). However, the step S105 is not a necessary step in present disclosure, that is, the step S105 can be omitted or retained according to different situations.

Figure 7:
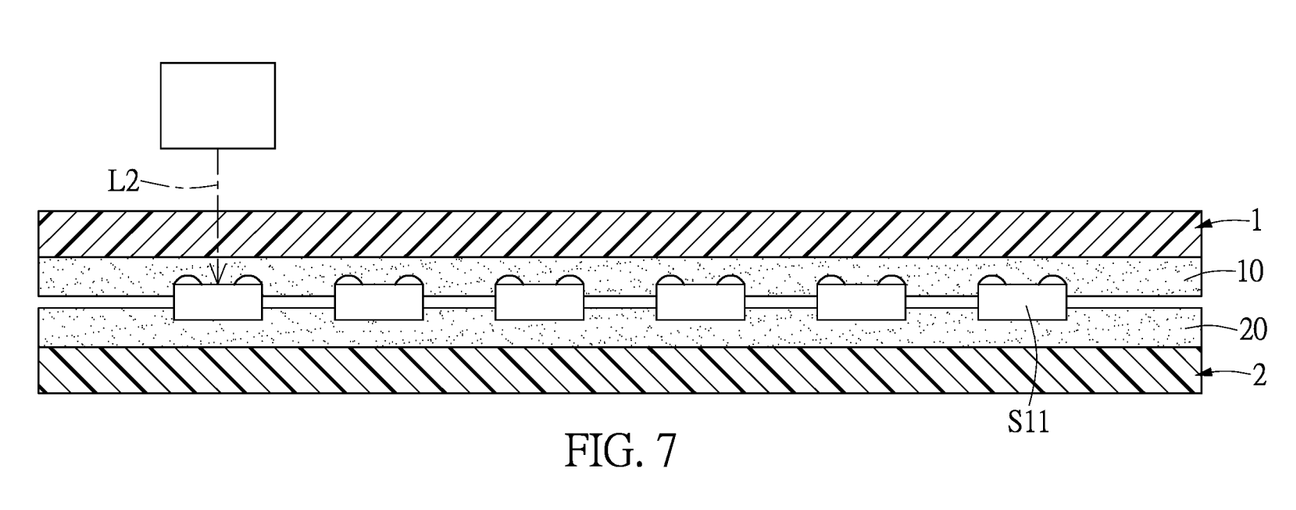
FIG. 7 is a side view of steps S106 and S108 in the method for manufacturing the light-emitting module according to the first embodiment of the present disclosure.

Referring to FIG. 1 and FIG. 7, the first supporting substrate 1 with the light-emitting chips S11 is disposed on a second adhesive layer 20 of a second supporting substrate 2. The light-emitting chips S11 are attached on the second adhesive layer 20 and the back of each the light-emitting chip S11 is covered by the second adhesive layer 20 (step S106). That is, after disposing the first supporting substrate 1 with the light-emitting chips S11 on the second adhesive layer 20 of the second supporting substrate 2, a part of each the light-emitting chip S11 will embed in the second adhesive layer 20.

Then, referring to FIG. 1 and FIG. 7, a contact surface between each the light-emitting chip S11 and the second adhesive layer 20 is irradiated by a second light source L2 (step S108). For example, the second light source L2 can sequentially irradiate every contact surface between each the light-emitting chip S11 and the second adhesive layer 20; or, the second light source L2 can also simultaneously irradiate multiple contact surfaces between each the light-emitting chip S11 and the second adhesive layer 20 in a larger radiation area, but is not limited thereto.

Figure 8:
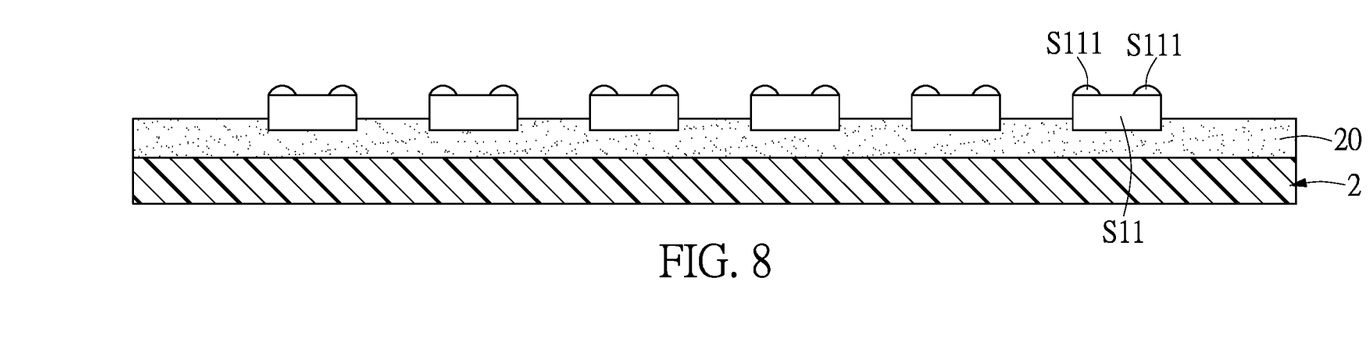
FIG. 8 is a side view of step S110 in the method for manufacturing the light-emitting module according to the first embodiment of the present disclosure.

Referring to FIG. 1, FIG. 7, and FIG. 8, the first supporting substrate 1 is separated from each the light-emitting chip S11 by a radiation of the second light source L2. At least two lands S111 of each light-emitting chip S11 are exposed out of the second adhesive layer 20 (step S110). Further, referring to FIG. 7, the second light source L2 passes through the first supporting substrate 1 and projects on the contact surface between each the light-emitting chip S11 and the first adhesive layer 10 to separate the first adhesive layer 10 of the first supporting substrate 1 from each the light-emitting chip S11. That is, the adherence between the light-emitting chips S11 and the first adhesive layer 10 can be weakened by the radiation of the second light source L2 onto the first adhesive layer 10 of the first supporting substrate 1 for ease of separating the first adhesive layer 10 of the first supporting substrate 1 from the light-emitting chips S11.

Figure 9:
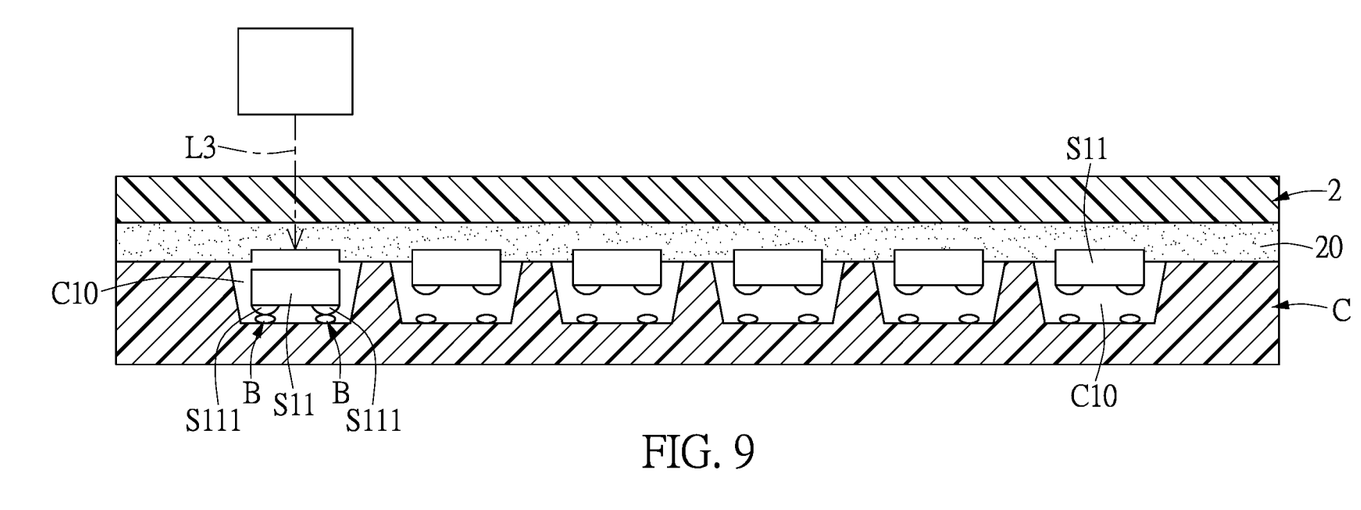
FIG. 9 is a side view of steps S112 and S114 in the method for manufacturing the light-emitting module according to the first embodiment of the present disclosure.

Referring to FIG. 1 and FIG. 9, a contact surface between each the light-emitting chip S11 and the second adhesive layer 20 is irradiated by a third light source L3 (step S112). Each the light-emitting chip S11 is separated from the second supporting substrate 2 by a radiation of the third light source L3 (step S114). Further, referring to FIG. 9, the third light source L3 passes through the second supporting substrate 2 and projects on the contact surface between each the light-emitting chip S11 and the second adhesive layer 20 to separate each the light-emitting chip S11 from the second adhesive layer 20 of the second supporting substrate 2. That is, the adherence between the second adhesive layer 20 and the light-emitting chips S11 can be weakened by the radiation of the third light source L3 onto the second adhesive layer 20 of the second supporting substrate 2 so as to separate the light-emitting chips S11 from the second adhesive layer 20.

Referring to FIG. 1 and FIG. 9, each the light-emitting chip S11 is disposed on a circuit board C. The at least two lands S111 of each the light-emitting chip S11 are electrically connected to the circuit board C through two solder balls B (step S116). For example, the circuit board C can be a thin-film transistor (TFT) or other types of supporting substrates, but is not limited thereto.

Figure 10:
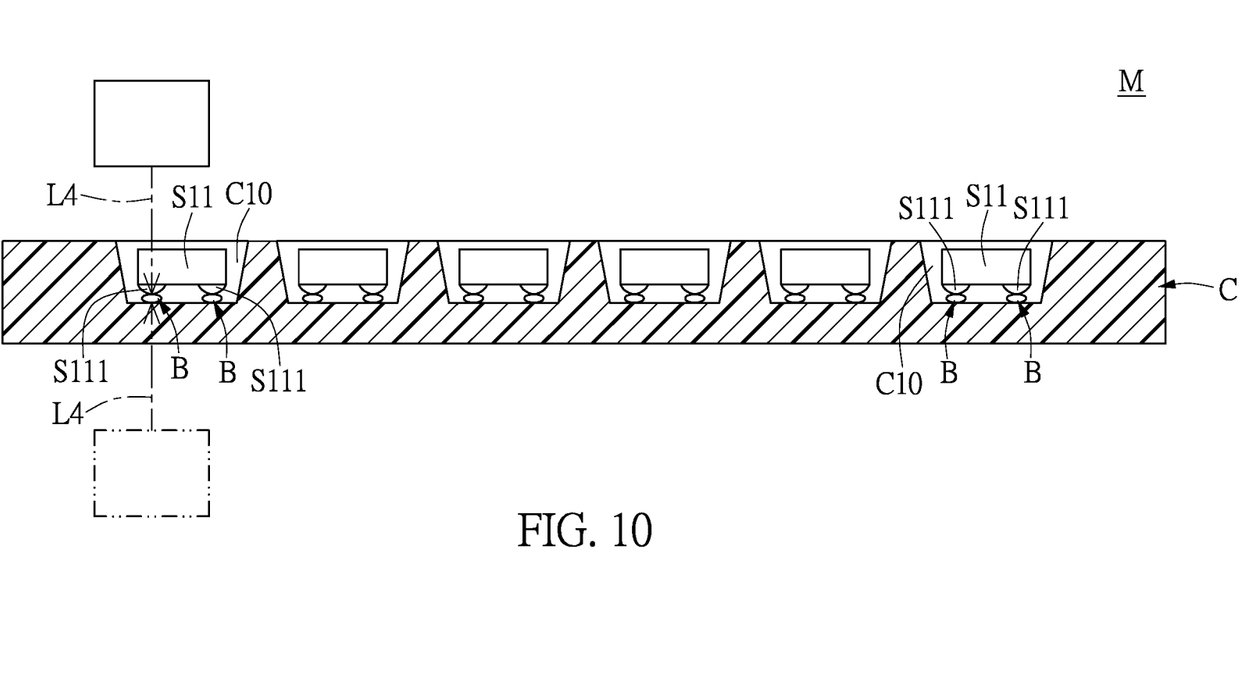
FIG. 10 is a side view of steps S116 and S118 in the method for manufacturing the light-emitting module according to the first embodiment of the present disclosure.

At last, referring to FIG. 1 and FIG. 10, the solder balls B are irradiated by a fourth light source L4 to firmly connect the at least two lands S111 of each the light-emitting chip S11 with the corresponding two solder balls B (step S118) which completes the preparation of the light-emitting module. Further, referring to FIG. 10, the fourth light source L4 passes through each light-emitting chip S11 or the circuit board C and projects on the solder balls B so as to make the solder balls B firmly connected between the corresponding lands S111 and the circuit board C. For example, the light-emitting module M can be applied to lighting devices or LED display devices, but is not limited thereto.

For example, the first light source L1 and the fourth light source L4 can be infrared light sources or other types of light sources, such as any visible light sources or any invisible light sources. A type of the second light source L2 and a type of the third light source L3 can be the same or different; besides, the second light source L2 and the third light source L3 can be ultraviolet laser light sources, infrared laser light sources, or other types of light sources, such as any visible light sources or any invisible light sources. The first adhesive layer 10 and the second adhesive layer 20 are formed by ultraviolet resins or other types of optical resins, but are not limited thereto.

For example, referring to FIG. 9 and FIG. 10, a plurality of trenches C10 are formed on the circuit board C and located according to a predetermined shape. The plurality of light-emitting chips S11 respectively disposed in the plurality of trenches C10. It should be noted that the circuit board C is aligned with the second supporting substrate 2 borne with the light-emitting chips S11 by an image capture device (such as a camera) to make the locations of the light-emitting chips S11 (such as a first aligned pattern) correspond to the locations of the trenches C10 (such as a second aligned pattern) before the step S112. Therefore, the light-emitting chips S11 can be accurately disposed in the corresponding trenches C10, but the present disclosure is not limited thereto.

For example, referring to FIG. 9, the third light source L3 can only irradiate one of the contact surfaces between the light-emitting chips S11 and the second adhesive layer 20 to separate the one of the light-emitting chips S11 from the second supporting substrate 2 rather than to separate all the light-emitting chips S11 from the second supporting substrate 2. In other words, if in a special situation, for instance, one of the light-emitting chips S11 is broken, the broken light-emitting chip S11 can be separated from the second supporting substrate 2 by the radiation of the third light source L3 to be fixed.

Second Embodiment

Figure 11:
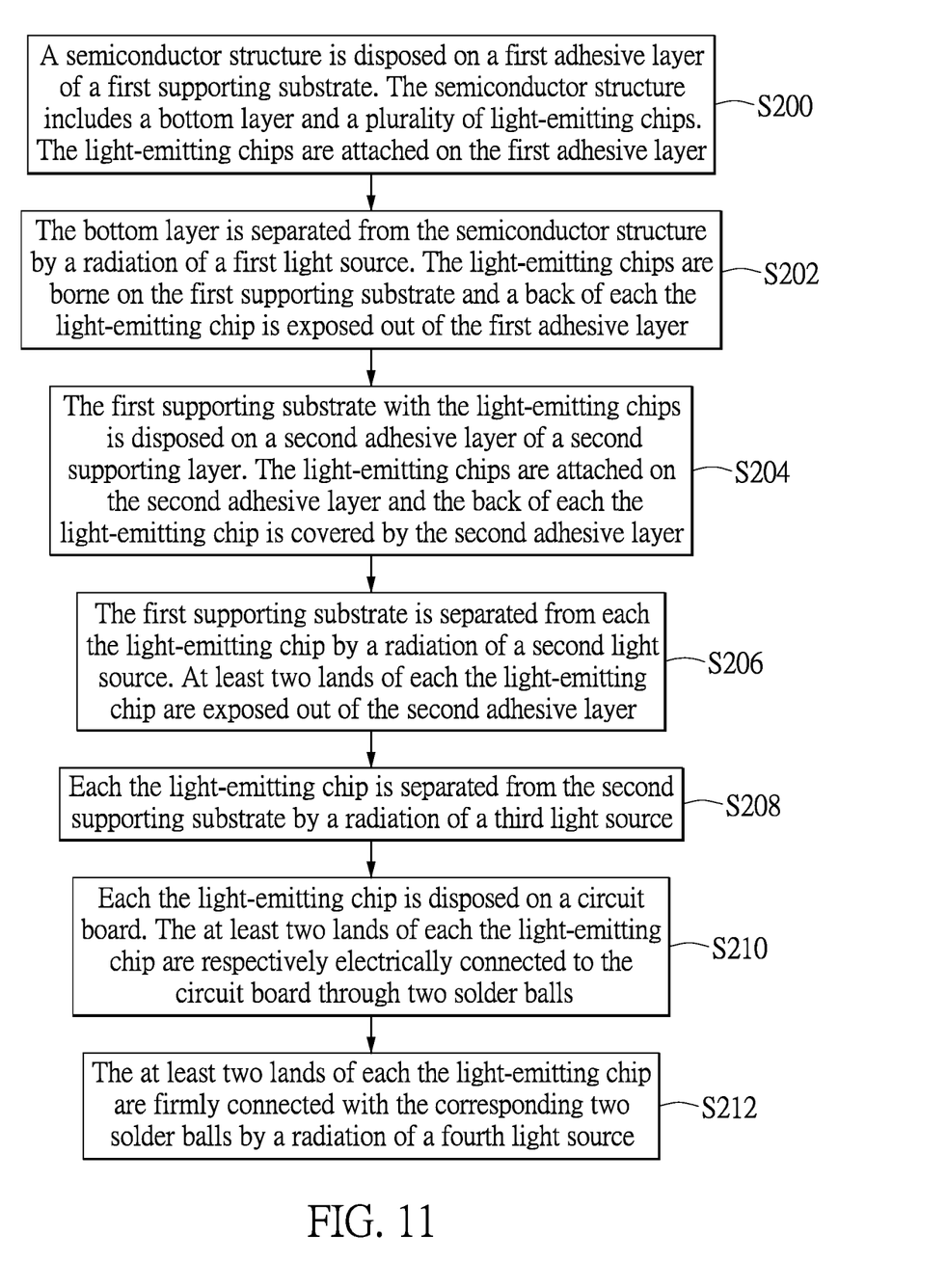
FIG. 11 is a flowchart of the method for manufacturing the light-emitting module according to a second embodiment of the present disclosure.

Referring to FIG. 11, a second embodiment of the present disclosure provides a method for manufacturing the light-emitting module M. Please refer to FIG. 2 to FIG. 10 as examples to assist comprehension, but is not limited thereto.

The method for manufacturing the light-emitting module M of the second embodiment of the present disclosure can be conducted by steps as follow. At first, a semiconductor structure S is disposed on a first adhesive layer 10 of a first supporting substrate 1. The semiconductor structure S includes a bottom layer S10 and a plurality of light-emitting chips S11 separately disposed on the bottom layer S10. The light-emitting chips S11 are attached on the first adhesive layer 10 (step S200). Then, as shown in FIG. 4 and FIG. 5, the bottom layer S10 is separated from the semiconductor structure S by a radiation of a first light source L1. The light-emitting chips S11 are borne on the first supporting substrate 1 and a back of each the light-emitting chip S11 is exposed out of the first adhesive layer 10 (step S202). As shown in FIG. 6 and FIG. 7, the first supporting substrate 1 with the light-emitting chips S11 is disposed on a second adhesive layer 20 of a second supporting layer 2. The light-emitting chips S11 are attached on the second adhesive layer 20 and the back of each the light-emitting chip S11 is covered by the second adhesive layer 20 (step S204). Next, as shown in FIG. 7 and FIG. 8, the first supporting substrate 1 is separated from each the light-emitting chip S11 by a radiation of a second light source L2. At least two lands S111 of each the light-emitting chip S11 are exposed out of the second adhesive layer 20 (step S206). As shown in FIG. 9, each the light-emitting chip S11 is separated from the second supporting substrate 2 by a radiation of a third light source L3 (step S208). Then, as shown in FIG. 9, each the light-emitting chip S11 is disposed on a circuit board C. The at least two lands S111 of each the light-emitting chip S11 are respectively electrically connected to the circuit board C through two solder balls B (step S210). Finally, as shown in FIG. 10, the at least two lands S111 of each the light-emitting chip S11 are firmly connected with the corresponding two solder balls B by a radiation of a fourth light source L4 to complete the preparation of the light-emitting module M (step S212).

Third Embodiment

Figure 12:
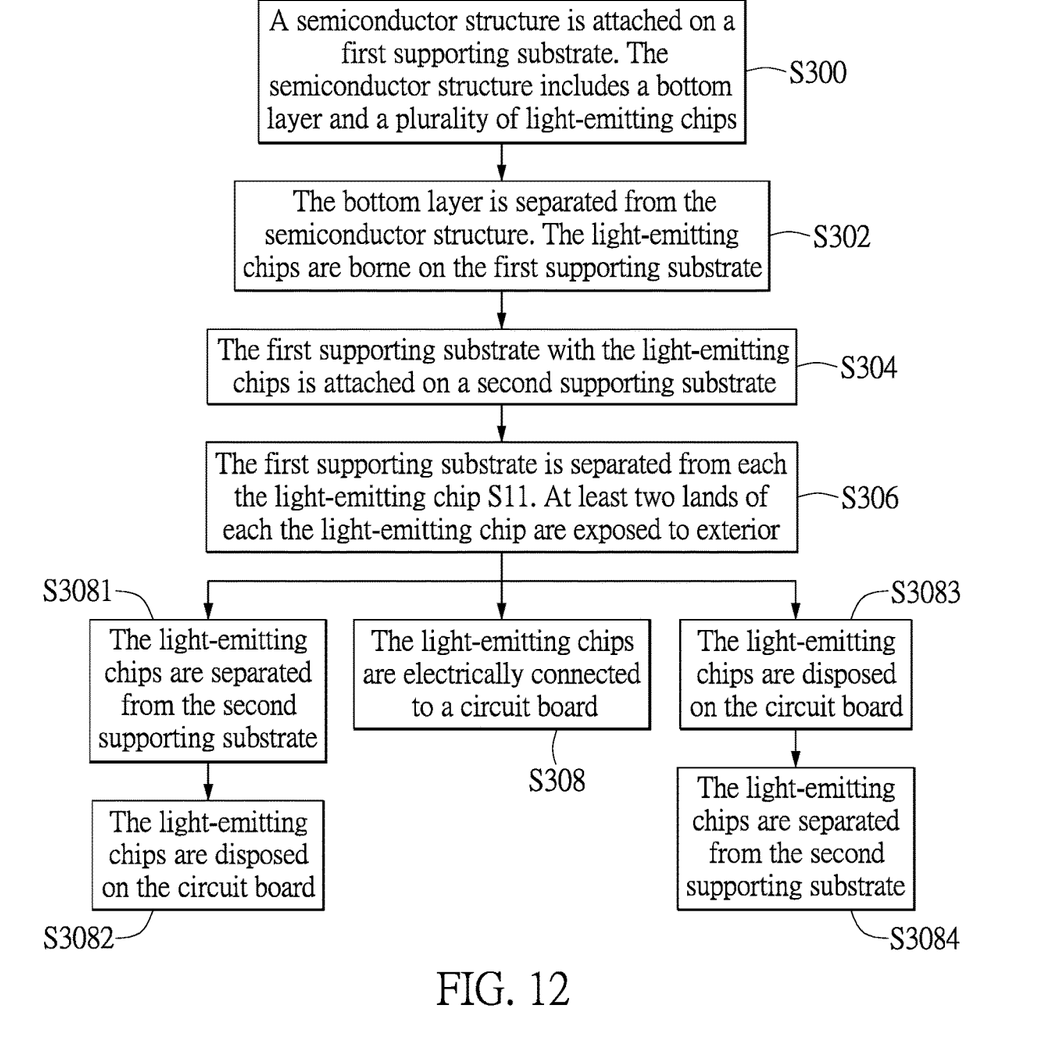
FIG. 12 is a flowchart of the method for manufacturing the light-emitting module according to a third embodiment of the present disclosure.

Referring to FIG. 12, a third embodiment of the present disclosure provides a method for manufacturing the light-emitting module M. Please refer to FIG. 2 to FIG. 10 as examples to comprehend of the third embodiment of the present disclosure, but is not limited thereto.

The method for manufacturing the light-emitting module M can be conducted by steps as follow. At first, as shown in FIG. 2 and FIG. 3, a semiconductor structure S is attached on a first supporting substrate 1. The semiconductor structure S includes a bottom layer S10 and a plurality of light-emitting chips S11 separately disposed on the bottom layer S10 (step S300). Then, as shown in FIG. 4 and FIG. 5, the bottom layer S10 is separated from the semiconductor structure S. The light-emitting chips S11 are borne on the first supporting substrate 1 (step S302). As shown in FIG. 6 and FIG. 7, the first supporting substrate 1 with the light-emitting chips S11 is attached on a second supporting substrate 2 (step S304). Next, as shown in FIG. 7 and FIG. 8, the first supporting substrate 1 is separated from each the light-emitting chip S11. At least two lands S111 of each the light-emitting chip S11 are exposed to exterior (step S306). The light-emitting chips S11 are electrically connected to a circuit board C to complete the preparation of the light-emitting module M (step S308).

Specifically, the step of electrically connecting the light-emitting chips S11 to the circuit board C further includes a step (A) or a step (B). The step (A) includes that the light-emitting chips S11 are separated from the second supporting substrate 2 (step S3081) and then are disposed on the circuit board C (step S3082). The step (B) includes that the light-emitting chips S11 are disposed on the circuit board C (step S3083) and then are separated from the second supporting substrate 2 (step S3084). In other words, according to different operating requirements, the light-emitting chips S11 can be separated from the second supporting substrate 2 at first and then be disposed on the circuit board C; or the light-emitting chips S11 can be disposed on the circuit board C at first and then be separated from the second supporting substrate 2.

In conclusion, the method for manufacturing the light-emitting module M of the present disclosure provides technical features of "disposing or attaching a semiconductor structure S on a first supporting substrate 1", "separating the bottom layer S10 from the semiconductor structure 5", "disposing or attaching the first supporting substrate 1 with the light-emitting chips S11 on a second supporting substrate 2", "separating the first supporting substrate 1 from each the light-emitting chips S11", and "electrically connecting the light-emitting chips S11 with a circuit board C" to complete the preparation of the light-emitting module M.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A method for manufacturing a light-emitting module, comprising:
    disposing a semiconductor structure on a first adhesive layer of a first supporting substrate; wherein the semiconductor structure includes a bottom layer and a plurality of light-emitting chips separately disposed on the bottom layer, and the light-emitting chips are attached on the first adhesive layer;
    irradiating a contact surface between each the light-emitting chip and the bottom layer by a first light source;
    separating the bottom layer from the semiconductor structure by a radiation of the first light source; wherein the light-emitting chips are borne on the first supporting substrate and a back of each the light-emitting chip is exposed out of the first adhesive layer;
    disposing the first supporting substrate with the light-emitting chips on a second adhesive layer of a second supporting substrate; wherein the light-emitting chips are attached on the second adhesive layer and the back of each the light-emitting chip is covered by the second adhesive layer;
    irradiating a contact surface between each the light-emitting chip and the first adhesive layer by a second light source;
    separating the first supporting substrate from each the light-emitting chip by a radiation of the second light source; wherein at least two lands of each the light-emitting chip are exposed out of the first adhesive layer;

irradiating a contact surface between each the light-emitting chip and the second adhesive layer by a third light source;

separating each the light-emitting chip from the second supporting substrate by a radiation of the third light source;

disposing each the light-emitting chip on a circuit board; wherein the at least two lands of each light-emitting chip are respectively electrically connected to the circuit board through two solder balls; and irradiating the solder balls by a fourth light source to connect the at least two lands of each the light-emitting chip with the corresponding two solder balls.

2. The method for manufacturing the light-emitting module according to claim 1, wherein the first light source and the fourth light source are infrared laser light sources, a type of the second light source and a type of the third light source are the same or different, the second light source and the third light source are ultraviolet laser light sources or infrared laser light sources, and the first adhesive layer and the second adhesive layer are formed by ultraviolet resins.

3. The method for manufacturing the light-emitting module according to claim 1, after the step of separating the bottom layer from the semiconductor structure, further comprising a step of removing gallium-containing residues attached on the back of each the light-emitting chip and a part of the first adhesive layer by an acid solution to expose the back of each the light-emitting chip.

4. The method for manufacturing the light-emitting module according to claim 1, wherein the circuit board has a plurality of trenches located according to a predetermined shape, the light-emitting chips are respectively disposed in the trenches, and the light-emitting chips respectively correspond to the trenches.

5. The method for manufacturing the light-emitting module according to claim 1, wherein the first light source passes through the bottom layer and projects on the contact surface between each the light-emitting chip and the bottom layer to separate the bottom layer from each the light-emitting chip; wherein the second light source passes through the first supporting substrate and projects on the contact surface between each the light-emitting chip and the first adhesive layer to separate the first adhesive layer of the first supporting substrate from each the light-emitting chip; wherein the third light source passes through the second supporting substrate and projects on the contact surface between each the light-emitting chip and the second adhesive layer to separate each the light-emitting chip from the second adhesive layer of the second supporting substrate; wherein the fourth light source passes through each the light-emitting chip or the circuit board and projects on the solder balls to make the solder balls connected between the lands and the circuit board.

6. A method for manufacturing a light-emitting module, comprising:

disposing a semiconductor structure on a first adhesive layer of a first supporting substrate; wherein the semiconductor structure includes a bottom layer and a plurality of light-emitting chips separately disposed on the bottom layer, and the light-emitting chips are attached on the first adhesive layer;

separating the bottom layer form the semiconductor structure by a radiation of a first light source; wherein the light-emitting chips are borne on the first supporting substrate and a back of each the light-emitting chip is exposed out of the first adhesive layer;

disposing the first supporting substrate with the light-emitting chips on a second adhesive layer of a second supporting substrate; wherein the light-emitting chips are attached on the second adhesive layer and the back of each the light-emitting chips is covered by the second adhesive layer;

separating the first supporting substrate from each the light-emitting chip by a radiation of a second light source; wherein at least two lands of each the light-emitting chip are exposed out of the first adhesive layer;

separating each the light-emitting chip from the second supporting substrate by a radiation of a third light source;

disposing each the light-emitting chip on a circuit board; wherein the at least two lands of each light-emitting chip are electrically connected to the circuit board through two solder balls; and connecting the at least two lands of each the light-emitting chip with the corresponding solder balls by a radiation of a fourth light source.

7. The method for manufacturing the light-emitting module according to claim 6, after the step of separating the bottom layer from the semiconductor structure, further comprising a step of removing gallium-containing residues attached on the back of each the light-emitting chip by an acid solution; wherein the circuit board has a plurality of trenches located according to a predetermined shape, the light-emitting chips are respectively disposed in the trenches, and the light-emitting chips corresponds to the trenches.

8. The method for manufacturing the light-emitting module according to claim 6, wherein the first light source passes through the bottom layer and projects on the contact surface between each the light-emitting chip and the bottom layer to separate the bottom layer from each the light-emitting chip; wherein the second light source passes through the first supporting substrate and projects on a contact surface between each the light-emitting chip and the first adhesive layer to separate the first adhesive layer of the first supporting substrate from each the light-emitting chip; wherein the third light source passes through the second supporting substrate and projects on a contact surface between each the light-emitting chip and the second adhesive layer to separate each the light-emitting chip from the second adhesive layer of the second supporting substrate; wherein the fourth light source passes through each the light-emitting chip or the circuit board and projects on the solder balls to make the solder balls connected between the lands and the circuit board.

9. A method for manufacturing a light-emitting module, comprising:

attaching a semiconductor structure on a first supporting substrate; wherein the semiconductor structure includes a bottom layer and a plurality of light-emitting chips disposed on the bottom layer;

separating the bottom layer form the semiconductor structure; wherein the light-emitting chips are borne on the first supporting substrate;

attaching the first supporting substrate with the light-emitting chips on a second supporting substrate;

separating the first supporting substrate from each the light-emitting chip; wherein at least two lands of each the light-emitting chip are exposed to exterior; and electrically connecting the light-emitting chips to a circuit board; wherein the step of electrically connecting the light-emitting chips to the circuit board further comprises disposing the light-emitting chips on the circuit board and then separating the light-emitting chips from the second supporting substrate.

10. The method for manufacturing the light-emitting module according to claim 9, after the step of separating the bottom layer from the semiconductor structure, further comprising a step of removing the gallium-containing residues attached on a back of each light-emitting chip by an acid solution; wherein the circuit board has a plurality of trenches located according to a predetermined shape; the light-emitting chips are disposed in the corresponding trenches.

* * * * *